United States Patent
Trefonas, III et al.

(10) Patent No.: US 10,167,411 B2
(45) Date of Patent: *Jan. 1, 2019

(54) NEUTRAL LAYER POLYMERS, METHODS OF MANUFACTURE THEREOF AND ARTICLES COMPRISING THE SAME

(71) Applicants: Dow Global Technologies LLC, Midland, MI (US); ROHM AND HAAS ELECTRONIC MATERIALS LLC, Marlborough, MA (US)

(72) Inventors: Peter Trefonas, III, Medway, MA (US); Phillip D. Hustad, Watertown, MA (US); Deyan Wang, Hudson, MA (US); Rahul Sharma, Pearland, TX (US); Mingqi Li, Shrewsbury, MA (US); Jieqian J. Zhang, Southborough, MA (US)

(73) Assignees: DOW GLOBAL TECHNOLOGIES LLC, Midland, MI (US); ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/190,481

(22) Filed: Jun. 23, 2016

(65) Prior Publication Data
US 2017/0327712 A1 Nov. 16, 2017

Related U.S. Application Data

(63) Continuation of application No. 14/297,095, filed on Jun. 5, 2014, now Pat. No. 9,382,444, which is a (Continued)

(51) Int. Cl.
*C09D 153/00* (2006.01)
*C08L 53/00* (2006.01)
(Continued)

(52) U.S. Cl.
CPC ........ *C09D 153/00* (2013.01); *B81C 1/00031* (2013.01); *C08F 293/005* (2013.01);
(Continued)

(58) Field of Classification Search
CPC ...................................... C08L 53/00
See application file for complete search history.

(56) References Cited

U.S. PATENT DOCUMENTS

| 4,929,510 A | 5/1990 | Ruckenstein et al. |
| 7,160,551 B2 | 1/2007 | McHugh et al. |

(Continued)

FOREIGN PATENT DOCUMENTS

| JP | 2012066536 A | 4/2012 |
| WO | WO2013040483 A1 | 3/2013 |
| WO | 2013104499 A1 | 7/2013 |

OTHER PUBLICATIONS

Bates et al. "Polarity-Switching Top Coats Enable Orientation of Sub-10-nm Block Copolymer Domains" Science, Nov. 9, 2012, vol. 338, 775-779.
(Continued)

*Primary Examiner* — Vickey Nerangis
(74) *Attorney, Agent, or Firm* — Cantor Colburn LLP

(57) ABSTRACT

Disclosed herein is a block copolymer comprising a first segment and a second segment that are covalently bonded to each other and that are chemically different from each other; where the first segment has a first surface free energy and where the second segment has a second surface free energy; and an additive copolymer; where the additive copolymer comprises a surface free energy reducing moiety where the surface free energy reducing moiety has a lower surface free energy than that of the first segment and the second segment; the additive copolymer further comprising one or more moieties having an affinity to the block copolymer; where
(Continued)

the surface free energy reducing moiety is chemically different from the first segment and from the second segment; where the additive copolymer is not water miscible; and where the additive copolymer is not covalently bonded with the block copolymer.

10 Claims, 10 Drawing Sheets

Related U.S. Application Data continuation-in-part of application No. 13/924,891, filed on Jun. 24, 2013, now abandoned.

(51) Int. Cl.
*C08F 293/00* (2006.01)
*B81C 1/00* (2006.01)
*G03F 7/00* (2006.01)
*C08L 83/10* (2006.01)
*C08G 77/442* (2006.01)

(52) U.S. Cl.
CPC .............. *C08L 53/00* (2013.01); *C08L 83/10* (2013.01); *G03F 7/0002* (2013.01); *B81C 2201/0149* (2013.01); *C08F 2438/03* (2013.01); *C08G 77/442* (2013.01)

(56) References Cited

U.S. PATENT DOCUMENTS

| | | | |
|---|---|---|---|
| 8,425,982 B2 | 4/2013 | Regner | |
| 9,382,444 B2 * | 7/2016 | Trefonas, III | C09D 153/00 |
| 2006/0228653 A1 | 10/2006 | Colburn | |
| 2008/0233435 A1 | 9/2008 | Hasegawa | |
| 2009/0181171 A1 | 7/2009 | Cheng et al. | |
| 2010/0297847 A1 | 11/2010 | Cheng | |
| 2012/0301677 A1 | 11/2012 | Russell | |
| 2013/0078576 A1 | 3/2013 | Wu | |
| 2013/0209757 A1 | 8/2013 | Willson | |
| 2014/0377518 A1 | 12/2014 | Trefonas, III et al. | |
| 2014/0378592 A1 | 12/2014 | Trefonas, III et al. | |

OTHER PUBLICATIONS

Du Yeol Ryu, et al. "A Generalized Approach to the Modification of Solid Surfaces" Science Apr. 8, 2005, vol. 308, 236-239.
Huang, E. et al. "Using surface active random copolymers to control the domain orientation in diblock copolymer thin films." Macromolecules 31.22 (1998): 7641-7650.
Nealey et al. "Generalization of the Use of Random Copolymers to Control the Wetting Behavior of Block Copolymer Films" Macromolecules 2008, 41, 9098-9103.
P. Mansky, et al. "Controlling Polymer-Surface Interactions with Random Copolymer Brushes Brushes" Science 275, 1458 (1997).
Sanders et al. "Hexafluoroalcohol-functionalized Methacrylate Monomers for Lithographic/Nanopatterning Materials", Sigma-Aldrich's Material Matters, vol. 6, Article 1. Nov. 29, 2011—pp. 1-7.
Son, et al. "Surfactant-Assisted Orientation of Thin Diblock Copolymer Films" Advanced Materials 2008, 20, 3643-3648.
Kim et al.; "Phase transition behavior in thin films of block copolymers by use of immiscible solvent vapors"; The Royal Society of Chemistry, Soft Matter; vol. 7; 2011, pp. 443-447.

* cited by examiner

Symmetric wetting

Neutral surface and interface

NEUTRAL LAYER POLYMERS, METHODS OF MANUFACTURE THEREOF AND ARTICLES COMPRISING THE SAME

CROSS REFERENCE TO RELATED APPLICATIONS

This application is a continuation of U.S. application Ser. No. 14/297,095 filed Jun. 5, 2014 which claims priority to Ser. No. 13/924,891 filed on Jun. 24, 2013, now abandoned, the entire contents of both are hereby incorporated by reference.

BACKGROUND

This disclosure relates to neutral layer polymers for self-assembled structures, methods of manufacture thereof and to articles comprising the same. In particular, the present disclosure relates to embedded neutral layers that are produced on a block copolymer and that facilitate the production of domains that are perpendicular to the substrate.

Block copolymers form self-assembled nanostructures in order to reduce the free energy of the system. Nanostructures are those having average largest widths or thicknesses of less than 100 nanometers. The self-assembly produces periodic structures as a result of the reduction in free energy. The periodic structures can be in the form of microdomains, for example, lamellae or cylinders. Because of these structures, thin films of block copolymers provide spatial chemical contrast at the nanometer-scale and, therefore, they have been used as an alternative low-cost nano-patterning material for generating periodic nanoscale structures. While these block copolymer films can provide contrast at the nanometer scale, it is however often very difficult to produce copolymer films that can display periodicity at less than 20 nanometers. Modern electronic devices however often utilize structures that have a periodicity of less than 20 nanometers and it is therefore desirable to produce copolymers that can easily display structures that have average largest widths or thicknesses of less than 20 nanometers, while at the same time displaying a periodicity of less than 20 nanometers.

Many attempts have been made to develop copolymers that have average largest widths or thicknesses of less than 20 nanometers, while at the same time displaying a periodicity of less than 20 nanometers. The following discussion details some of the attempts that have been made to accomplish this.

FIGS. 1(A) and 1(B) depict examples of lamella forming block copolymers that are disposed upon a substrate. The block copolymer comprises a block A and a block B that are reactively bonded to each other and that are immiscible with each other. The lamellae can align their microdomains to be either parallel (FIG. 1(A)) or perpendicular (FIG. 1(B)) to the surface of a substrate upon which they are disposed. The affinity of the block A and/or block B for the surface of the substrate determines the morphology on the substrate surface. Likewise, the affinity of the block A and/or block B for air determines the morphology at the air-block copolymer interface. The air-block copolymer interface is termed the free surface. The lamellae can also align their microdomains to be both parallel and perpendicular to the substrate (FIG. 1(C)). In the FIG. 1(C), the lamellae of block A are perpendicular to a plane parallel to the substrate surface, while being parallel to the substrate at the upper surface that contacts air.

The perpendicularly oriented lamellae provide nanoscale line patterns, while there is no nanoscale surface pattern created by parallel oriented lamellae. Where lamellae form parallel to the plane of the substrate, one lamellar phase forms a first layer at the surface of the substrate (in the x-y plane of the substrate), and another lamellar phase forms an overlying parallel layer on the first layer, so that no lateral patterns of microdomains and no lateral chemical contrast form when viewing the film along the perpendicular (z) axis. When lamellae form perpendicular to the surface, the perpendicularly oriented lamellae provide nanoscale line patterns. Therefore, to form a useful pattern, control of the orientation of the self-assembled microdomains in the block copolymer thin films is desirable.

With reference to the FIG. 1(C), in order to expose the perpendicular lamellae to the air interface, the uppermost layer (identified as being a layer of the B block) is etched to expose both A and B microdomains to the free surface. The presence of both microdomains of the A block and the B block at the free surface (with both being perpendicular to the substrate) provides nanoscale line patterns that can be used for nano-patterning (i.e., the development of templates and resists (e.g., photoresists) for the development of semiconductors). In short, when the free surface interactions are unbalanced, a skin layer forms of the block with the lowest surface energy.

External orienting factors are often used to facilitate orientation of the block copolymer microdomains. Without external orientation control, thin films of block copolymers tend to self-organize into randomly oriented nanostructures with undesired morphologies, which are of little use for nano-patterning because of the random nature of the features. Orientation of block copolymer microdomains can be obtained by guiding the self-assembly process with an external orientation biasing method. Examples of this biasing method include the use of a mechanical flow field, an electric field, a temperature gradient, by using a surface modification layer upon which the block copolymer is disposed, or by adding a surfactant to the copolymer. The copolymers generally used for these particular form of guided self-assembly are polystyrene-polymethylmethacrylate block copolymers or polystyrene-poly(2-vinylpyridine) block copolymers.

The FIG. 2 details one method of using a surface modification layer upon which a block copolymer is disposed to produce a film having controlled microdomain sizes, periodicity and orientation. The method depicted in the FIG. 2, has been previously detailed by P. Mansky, Y. Liu, E. Huang, T. P. Russell, C. Hawker, Science 275 (1997), 1458. As with the FIG. 1, the block copolymer of the FIG. 2 comprises a block A and a block B. The substrate in the FIG. 2 is coated with a surface modification layer that is affixed to the surface. The surface modification layer is formed by cross-linking or is reactively bonded (covalently, ionically or hydrogen bonded) to the surface of the substrate. Any additional excess material is removed prior to or during the bonding. The block copolymer is then coated on the surface modification layer of the substrate.

Surfactants can also be an external orienting factor that can be used to control free surface interactions. Oleic acid has been used as a surfactant when casting a block copolymer comprising polystyrene and polymethylmethacrylate. The perpendicular morphology has been found to persist over a range of thicknesses when the copolymer was cast on non-neutral substrates. The block copolymer after being cast on a substrate is optionally annealed with heat (in the presence of an optional solvent), which allows for phase separation of the immiscible polymer blocks A and B. The annealed film can then be further developed by a suitable method such as immersion in a solvent/developer or by reactive ion etching which preferentially removes one polymer block and not the other to reveal a pattern that is commensurate with the positioning of one of the blocks in the copolymer.

While these particular methods of external orienting produce block copolymers, some of them are expensive (e.g., reactive ion etching) while others (e.g., the use of a surfactant) leave behind residues that make their use impractical.

SUMMARY

Disclosed herein is a block copolymer comprising a first segment and a second segment that are covalently bonded to each other and that are chemically different from each other; where the first segment has a first surface free energy and where the second segment has a second surface free energy; and an additive copolymer; where the additive copolymer comprises a surface free energy reducing moiety where the surface free energy reducing moiety has a lower surface free energy than that of the first segment and the second segment; the additive copolymer further comprising one or more moieties having an affinity to the block copolymer; where the surface free energy reducing moiety is chemically different from the first segment and from the second segment; where the additive copolymer is not water miscible; where the additive copolymer is not covalently bonded with the block copolymer; and where the additive copolymer is operative to form a neutral layer on a surface of the block copolymer and to facilitate formation of domains in the block copolymer that are perpendicular to a surface of the substrate that the composition is disposed on.

Disclosed herein too is a method comprising disposing on a substrate a composition comprising a block copolymer comprising a first segment and a second segment that are covalently bonded to each other and that are chemically different from each other; where the first segment has a first surface free energy and where the second segment has a second surface free energy; and an additive copolymer; where the additive copolymer comprises a surface free energy reducing moiety where the surface free energy reducing moiety has a lower surface free energy than that of the first segment and the second segment; the additive copolymer further comprising one or more moieties having an affinity to the block copolymer; where the surface free energy reducing moiety is chemically different from the first segment and from the second segment; where the additive copolymer is not water miscible; where the additive copolymer is not covalently bonded with the block copolymer; and where the additive copolymer is operative to form a neutral layer on a surface of the block copolymer and to facilitate formation of domains in the block copolymer that are perpendicular to a surface of the substrate that the composition is disposed on.

DETAILED DESCRIPTION

Figure 1A:
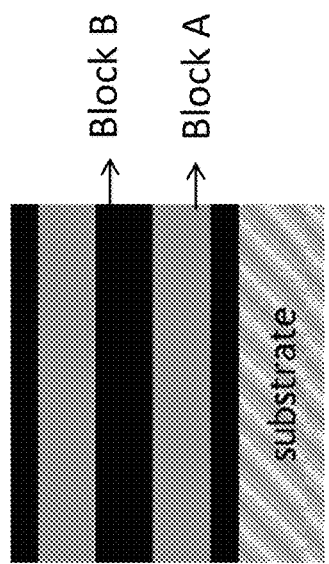
FIG. 1(A) depicts an example of microdomain-forming block copolymers that are disposed upon a substrate, where the microdomains are parallel to the surface of the substrate.
Figure 1B:
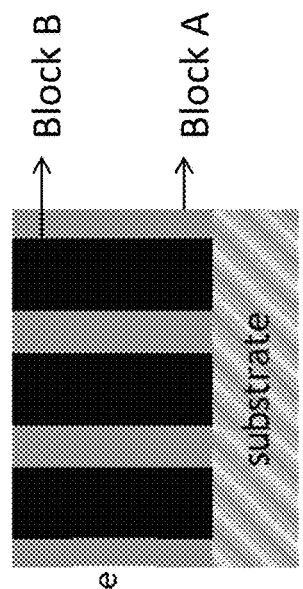
FIG. 1(B) depicts another example of microdomain forming block copolymers that are disposed upon a substrate, where the microdomain are perpendicular to the surface of the substrate.
Figure 1C:
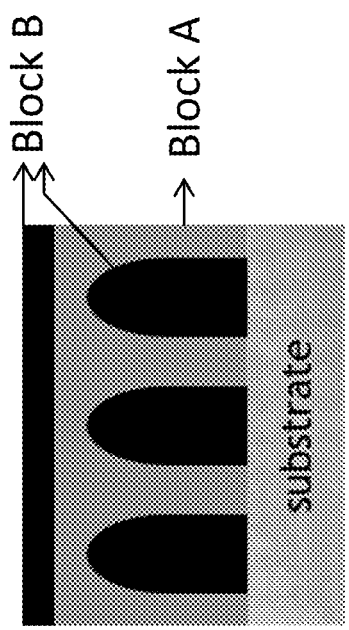
FIG. 1(C) depicts yet another example of microdomain forming block copolymers that are disposed upon a substrate, where the microdomains are perpendicular as well as parallel to the surface of the substrate.
Figure 2:
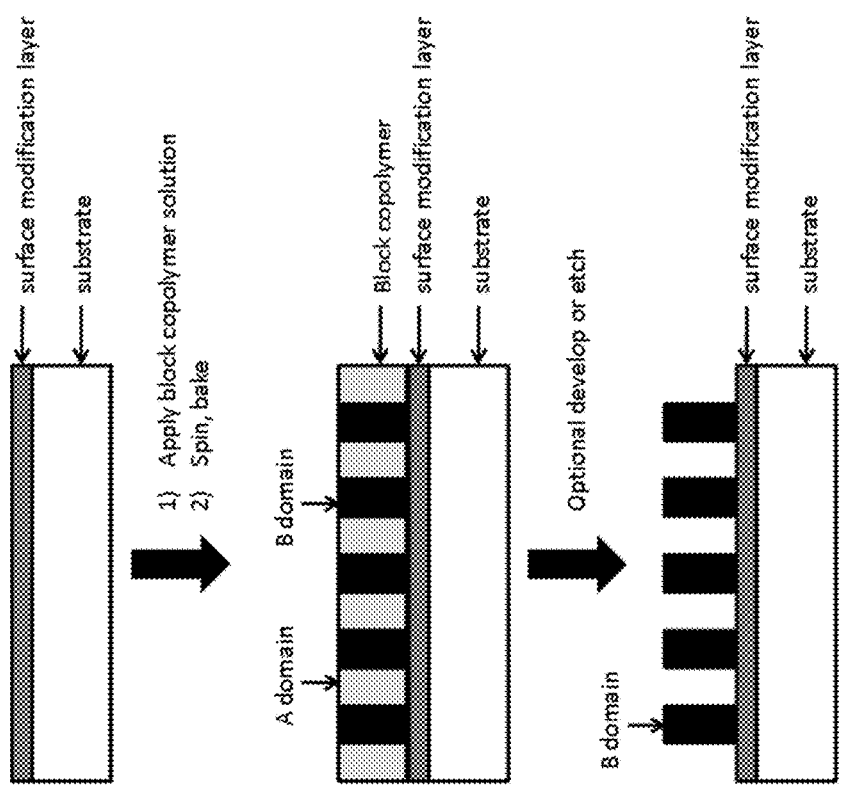
FIG. 2 details one method of using a surface modification layer upon which a block copolymer is disposed to produce a film having controlled microdomain size, periodicity and orientation.

Disclosed herein is a composition that comprises a block copolymer and an additive copolymer that comprises a polymeric surface free energy reducing moiety and at least one polymeric entity that is contained in the block copolymer or a polymeric entity that is not contained in the block copolymer but is compatible with the entity in the block copolymer. The polymeric surface free energy reducing moiety permits the formation of a first neutral layer at the air-block copolymer interface (hereinafter "the free surface") when the composition is disposed on a substrate or upon an optional neutral layer (hereinafter a "surface modification" layer) that is itself disposed upon the substrate. The additive copolymer can comprise a single copolymer or can comprise a blend of copolymers each of which comprise a surface energy reducing moiety. In a blend of copolymers, the surface free energy reducing moiety can be the same or can be different for each independent copolymer (i.e., each copolymer can have a different surface energy reducing moiety). The additive copolymer can also be viewed as an embedded neutral layer because it is intimately dispersed in the composition and phase separates only after being disposed upon a substrate to produce a neutral layer at the air-block copolymer interface and because it facilitates the formation of domains perpendicular to the surface of the substrate. Furthermore, the surface free energy reducing moiety enables thermal annealing of the composition at temperatures above the glass transition temperature of the block copolymer, as the surface free energy reducing moiety anchors the neutral layer on the top of the block copolymer and prevents it from continuing to be intimately mixed with the block copolymer.

Both the "polymeric surface free energy reducing moiety" and the at least "one polymeric entity" are either polymeric or are part of a polymer, hence the use of the prefix "polymeric". The additive copolymer may also be understood as being an embedded neutral layer that phase segregates after casting of the composition on the substrate to form an actual neutral layer at the free surface, while permitting the respective microdomains of the block copolymer to be oriented perpendicular to the substrate so that they can be used to form a nanostructure that is eventually used to form a resist (e.g., a photoresist) or a template for patterning a semiconductor. The surface free energy reducing moiety comprises silicon atoms, fluorine atoms, a substituted or unsubstituted $C_{1-12}$ hydrocarbyl group, or a combination thereof.

In another embodiment, the composition comprises a block copolymer comprising a first polymeric segment (hereinafter first segment) and a second polymeric segment (hereinafter second segment) that are covalently bonded to each other and that are chemically different from each other. The first segment has a first surface free energy and the second segment has a second surface free energy. The composition also comprises an additive copolymer that comprises a surface energy reducing moiety. The surface free energy reducing moiety has a lower surface free energy than that of the first surface free energy and the second surface free energy. As noted above, the additive copolymer further comprises one or more moieties having an affinity to the block copolymer; where the additive copolymer is not water miscible. The additive copolymer is not covalently bonded with the block copolymer and is operative to form a neutral layer on a surface of the block copolymer that facilitates the formation of domains in the block copolymer that are perpendicular to a surface of the substrate that the composition is disposed on.

Disclosed herein too is a method comprising disposing the composition (that comprises a block copolymer and an additive copolymer that comprises a polymeric surface free energy reducing moiety and at least one polymeric entity that is contained in the block copolymer or that is chemically compatible with the one polymeric entity that is contained in the block copolymer) upon the substrate or upon the optional neutral layer disposed upon the substrate. The method further comprises annealing the composition at a temperature from room temperature up to the highest glass transition temperature of the block copolymer (when all the polymers in the block copolymer are amorphous) or up to the highest melting point of the block copolymer (when at least one of the polymers in the block copolymer are semicrystalline).

The method further comprises annealing the composition at a temperature above the highest glass transition temperature of the block copolymer (when all the polymers in the block copolymer are amorphous) or above the highest melting point of the block copolymer (when at least one of the polymers in the block copolymer are semicrystalline) but below the order-disorder transition temperature of the block copolymer.

The annealing permits the formation of a neutral layer at the free surface and the formation of perpendicular microdomains on the substrate. The neutral layer is formed by the segregation of at least a portion of the polymeric surface free energy reducing moiety from the block copolymer on the surface of the block copolymer. The neutral layer may then be treated to expose the perpendicular microdomains of the block copolymer on the substrate.

The block copolymer can comprise two or more polymeric segments—a first segment and a second segment that are chemically dissimilar from each other and that are covalently bonded to each other and that phase segregate into microdomains upon being disposed upon the substrate. The first segment and/or the second segment may or may not contain the surface energy reducing moiety. In other words, the surface free energy reducing moiety has a different chemical composition from that of the first segment or that of the second polymer. In an exemplary embodiment, the block copolymer does not contain the surface free energy reducing moiety.

It is desirable for the microdomains to have an average width of less than or equal to 100 nanometers, specifically less than or equal to 70 nanometers, specifically less than or equal to 50 nanometers, and more specifically less than or equal to 20 nanometers. In an exemplary embodiment, it is desirable for the average width of the microdomains to be less than 20 nanometers. The width is measured parallel to the surface of the substrate (i.e., measured in a direction parallel to the y-axis and the z-axis in the FIG. 1(A) detailed above.). It is also desirable for the average interdomain periodicity to be less than or equal to 100 nanometers, specifically less than or equal to 70 nanometers, specifically less than or equal to 50 nanometers, and more specifically less than or equal to 20 nanometers. In an exemplary embodiment, it is desirable for the average interdomain periodicity of the microdomains to be less than equal to 20 nanometers.

As detailed above, the block copolymer is disposed upon the substrate or upon the surface modification layer to produce microdomains that are perpendicular to the surface of the substrate. By selecting a block copolymer whose surface energy differs as minimally as possible from the surface energy of the surface modification layer, the domain sizes, the domain geometry and the inter-domain spacing can be carefully controlled. It is desirable to select a block copolymer having a number average molecular weight for each block that enables the block copolymeric film to form lamellar or cylindrical domains having a perpendicular orientation to the surface of the substrate upon which the block copolymer is disposed.

Block copolymers are polymers that are synthesized from two or more different monomers and exhibit two or more polymeric chain segments that are chemically different, but yet, are covalently bound to one another. Diblock copolymers are a special class of block copolymers derived from two different monomers (e.g., A and B) and having a structure comprising a polymeric block of A residues (e.g., A segments) covalently bound to a polymeric block of B residues (e.g., B segments) (e.g., AAAAA-BBBBB). The block copolymer can comprise di-block copolymers, tri-block copolymers, star block copolymers, random copolymers, alternating block copolymers, multiblock copolymers, gradient block copolymers, or combinations thereof.

The term "segment" as used herein with regard to the block copolymer or the alternating block comprises a polymeric segment or a polymeric block. The polymeric segment or block can comprise a small number of repeat units (e.g., 1, 2, 3, 4, up to 20) so long as it is copolymerized with another polymeric segment to form a copolymer that has a molecular weight greater than or equal to about 2000 grams per mole.

The segments can in general be any appropriate domain-forming segment to which another chemically dissimilar segment can be attached. "Chemically dissimilar" implies that the two segments have different chemical structures. The different structures can be chemically different (i.e., have different molecules), racemically different (i.e., have left- and right-handed enantiomers of a chiral molecule) or isotopically different. Segments can be derived from different polymerizable monomers, where the segments can include polyolefins including polydienes, polyethers including poly(alkylene oxides) such as poly(ethylene oxide), poly(propylene oxide), poly(butylene oxide), poly((meth) acrylates), polystyrenes, polyesters, polyorganosiloxanes, or polyorganogermanes.

In one embodiment, the segments of the block copolymer comprise as monomers $C_{2-30}$ olefinic monomers, (meth) acrylate monomers derived from $C_{1-30}$ alcohols, inorganic-containing monomers including those based on iron, silicon, germanium, tin, aluminum, titanium, or a combination comprising at least one of the foregoing monomers. Exemplary monomers for use in the segments can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or a-methylstyrene; and can include as (meth)acrylate monomers, methyl (meth)acrylate, ethyl (meth)acrylate, n-propyl (meth)acrylate, isopropyl (meth)acrylate, n-butyl (meth)acrylate, isobutyl (meth) acrylate, n-pentyl (meth)acrylate, isopentyl (meth)acrylate, neopentyl (meth)acrylate, n-hexyl (meth)acrylate, cyclohexyl (meth)acrylate, isobornyl (meth)acrylate, or hydroxyethyl (meth)acrylate. Combinations of two or more of these monomers can be used.

Exemplary segments which are homopolymers can include segments prepared using styrene (i.e., polystyrene blocks), (meth)acrylate homopolymeric segments such as poly(methylmethacrylate), 2-vinylpyridine (i.e., poly(2-vinylpyridine blocks), or dialkylsiloxane (i.e., poly(dimethylsiloxane segments); exemplary random segments include, for example, segments of styrene and methyl methacrylate (e.g., poly(styrene-co-methyl methacrylate)), randomly copolymerized; and an exemplary alternating copolymer block can include segments of styrene and maleic anhydride, which is known to form a styrene-maleic anhydride diad repeating structure due to the inability of maleic anhydride to homopolymerize under most conditions (e.g., poly(styrene-alt-maleic anhydride)). It will be understood that such segments are exemplary and should not be considered to be limiting.

Exemplary block copolymers that are contemplated for use include diblock or triblock copolymers such as poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(styrene-b-trimethylsilylmethyl methacrylate), poly(methyl methacrylate-b-dimethylsiloxane), poly(methyl methacrylate-b-trimethylsilylmethyl methacrylate), or the like, or a combination comprising at least one of the foregoing block copolymers.

The block copolymer is present in the composition in an amount of 25 to 95 weight percent solids, based on the total weight of the composition. In a preferred embodiment, the block copolymer is present in the composition in an amount of 50 to 90 weight percent solids, based on the total weight of the composition.

The surface modification layer is an optional layer and its use depends upon the character of the substrate. If the substrate has the appropriate characteristics for facilitating the formation of perpendicular domains in the block copolymer, then a surface modification layer may not be desirable. If, on the other hand, the substrate does not possess favorable characteristics for facilitating the formation of perpendicular microdomains, then it may be desirable to use the surface modification layer. The surface modification layer can be characterized as having a similar surface tension between the surface modification layer and the respective polymers comprising the blocks of the block copolymer. In one embodiment, the surface modification layer comprises a random copolymer comprising two or more homopolymeric repeat units that have difference in surface energy of 0.01 to 10 milli-Newton per meter (mN/m), specifically 0.03 to 3 mN/m, and more specifically 0.04 to 1.5 mN/m. For example, neutral layers for polystyrene-b-polymethylmethacrylate usually comprise styrene and methylmethacrylate units, which only have a difference in surface energy of 0.04 mN/m from the respective blocks.

In an embodiment, it is desirable for the neutral layer, both on top and bottom of the film, to have a balanced surface tension between the neutral layer and the A and B blocks. Good results will be achieved when the surface tensions are equal. A number of materials can achieve this end result. In one embodiment, this can be achieved by using a random copolymer of the two monomers, e.g. P(S-r-MMA) for a block copolymer comprising PS-PMMA. In another embodiment, a random copolymer of different monomers where the surface energy of the respective materials are higher and lower than those of the individual polymer segments, or also a homopolymer that happens to have a surface energy that is approximately in between the two segments can be used to form the neutral layer.

Each repeat unit is chemically and/or structurally different from the other repeat unit in the random copolymer. The random copolymer comprises a first homopolymeric repeat unit having a surface energy of 35 to 50 milli-Newton per meter (mN/m) and a second repeat unit having a surface energy of 15 to 30 mN/m. The total surface energy of the random copolymer is 15 to 40 mN/m. The surface energy is calculated using the Owens-Wendt method from the contact angles of water (18 ohm deionized water) and methylene iodide ($CH_2I_2$) and diethylene glycol, which are measured on a contact angle goniometer by the Sessile Drop method.

In one embodiment, the surface modification layer comprises a random copolymer that can be crosslinked upon being disposed upon the substrate. The random copolymer comprises at least two repeat units at least one of which contains a reactive substituent that can be used to crosslink the random copolymer after it is disposed upon the substrate. The surface modification layer crosslinked in this manner is then described as being in the form of a mat-like film on the surface of the substrate.

In another embodiment, the surface modification layer comprises a random copolymer that comprises a reactive end group that can react with a functional group on the surface of the substrate to form a brush on the substrate. The surface modification layer disposed upon the substrate in this manner is then described as being in the form of a brush on the surface of the substrate.

In yet another embodiment, the surface modification layer comprises a random copolymer that comprises at least one reactive substituent along the chain backbone and in addition comprises a reactive end group that can react with a functional group disposed upon the surface of the substrate to form a brush on the substrate. A copolymer containing both reactive functionalities can thus form either a mat or a brush depending upon the kinetics of the reaction. For example, if the end groups are first reacted with the substrate followed by reacting the substituents, the surface modified film is expected to have characteristics that are more brush-like than mat-like. However, if the crosslinking reaction is first triggered, followed by reacting the surface groups, then the surface film will have characteristics that are more mat-like and less brush-like. Reaction conditions, the reactants, the solvents use to disperse the reactants, the chemistry of the substrate, and the structure and chemistry of the random copolymer can thus all be tailored to tune in the type of surface characteristics that are desired in the surface modification film and consequently in the block copolymer.

The additive copolymer (that is used to produce the embedded neutral layer) comprises a polymeric surface free energy reducing moiety and at least one polymeric entity that is also contained in the block copolymer or that is compatible with at least one polymeric entity contained in the block copolymer. The additive copolymer is not covalently bonded to the block copolymer. The additive copolymer is termed an embedded neutral layer because of its ability to phase segregate from the block copolymer and form an actual neutral layer on the surface of the block copolymer. The neutral layer also permits the segments of the block copolymer to form microdomains (that are perpendicular to the substrate) upon being disposed upon the substrate. The neutral layer further permits the block copolymer to be annealed above the glass transition temperature of the block copolymer as the surface free energy reducing moiety serves to anchor the layer at the top surface and minimizes intermixing with the block copolymer layer.

The polymeric surface free energy reducing moiety (hereinafter "surface energy reducing moiety") generally comprises silicon atoms, fluorine atoms, or a combination of fluorine atoms and silicon atoms. The surface free energy reducing moiety facilitates the segregation of the embedded neutral layer from the block copolymer. The surface free energy reducing moiety may be covalently bonded to at least one moiety that is contained in the block copolymer. For example, if the block copolymer contains two segments—a first segment A and a second segment B, then the additive copolymer may comprise one or more of the monomeric moieties that react to form segment A, one or more of the monomeric moieties that react to form segment B, or a combination of one or more of the monomeric moieties that react to form segment A and one or more of the monomeric moieties that react to form segment B, in addition to the surface energy reducing moiety. Examples of the monomers that can be used to form the segments of the additive copolymer are listed above in the details provided for the block copolymer (e.g., $C_{2-30}$ olefinic monomers, (meth)acrylate monomers derived from $C_{1-30}$ alcohols, and the like).

For a block copolymer comprising two segments—segment A and segment B, where segment A comprises repeat units of an exemplary unit A, and segment B comprises repeat units of an exemplary unit B, the additive copolymer may comprise one or more of the unit A, one or more of the unit B, or both the units A and B, in addition to a surface free energy reducing moiety X. In another embodiment, the additive copolymer may comprise one or more of a unit A', one or more of the unit B', or both the units A' and B', in addition to a surface free energy reducing moiety X, such that A' and B' are completely or partially miscible with A and B respectively. In one embodiment, A may be chemically similar or different from A', while B may be chemically similar or different from B'.

The following exemplary structures can be used to form the additive copolymer that eventually phase segregates from the block copolymer to form the neutral layer. It is assumed that the block copolymer comprises two segments A and B. In one embodiment, the additive copolymer is a random copolymer, or a block copolymer comprising repeat units A, B, or X and having the structure of formula (1)

(1)

where units A and B are similar to the units A and B in the block copolymer, and where X is the surface energy reducing moiety, where n is 0 to 50, specifically 1 to 45, m is 0 to 50, specifically 1 to 45, and where p is 1 to 50, specifically 5 to 40, where n, m and p are independent or each other, and where n and m are both not equal to 0 at the same time. The surface free energy reducing moiety X can therefore be a single unit or a plurality of units. In other words, it can be a reacted monomeric unit, an oligomeric unit (having between 2 to 10 repeat units) or a polymeric unit (having more than 10 repeat units). When the additive copolymer of the formula (1) is a random copolymer, the positions of A, B and X can be randomly interchanged. In an embodiment, A is present in an amount of 0 to 50 mole percent, specifically 1 to 40 mole percent, based on the total number of moles of the additive copolymer, B is present in an amount of 0 to 50 mole percent, specifically 1 to 40 mole percent, based on the total number of moles of the additive copolymer, and X is present in an amount of 1 to 50 mole percent, specifically 2 to 40 mole percent, based on the total number of moles of the additive copolymer.

In one embodiment, the additive copolymer is a random copolymer or a block copolymer comprising repeat units A, C, or X and having the structure of formula (2)

(2)

where C is an alternative unit that can be combined with the units A or B to achieve neutrality for the additive copolymer; and where n, m and p are as detailed above in the formula (1). The segment represented by unit C is referred to herein as the fifth block polymer. The molar content of A and X in the additive copolymer are detailed above, while the molar content of C is similar to that of B as detailed above.

In another embodiment, the additive copolymer can comprise a block copolymer comprising blocks of units A and B and blocks of X as shown by the structure of formula (3).

(3)

where units of A and B are arranged to alternate with each other and form a first block while the surface free energy reducing moiety X forms a second block; where o has a value of 1 to 50 and p has a value of 1 to 50; and where o and p are independent of each other. The molar content of A, B and X based on the total number of moles of the additive copolymer are detailed above.

In yet another embodiment, the additive copolymer may comprise a blend of copolymers of A and X, with B and X as shown in the formulas (4) and (5) or a blend of copolymers of A and X, with C and X as shown in the formulas (4) and (6) below

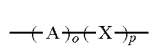 (4)

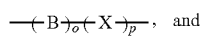 (5)

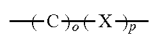 (6)

where A, B and C are as described above, and where o has a value of 1 to 50 and p has a value of 1 to 50; and where o and p are independent of each other. The copolymers of A and X, B and X, and C and X, can be alternating copolymers, di-block copolymers or random copolymers. In the formulas (4), (5) and (6), the structure of formula (4) is referred to as the additive copolymer, the structure of formula (5) is referred to as the second copolymer and the structure of formula (6) is referred to as the third copolymer. In other words, in the second copolymer of the formula (5), the surface free energy reducing moiety is covalently bonded to the unit (A or B) that the surface free energy reducing moiety in the additive copolymer is not covalently bonded to.

The copolymer of A and X and the copolymer of B and X, may be used in weight ratios of 1:99 to 99:1, specifically 10:90 to 90:10, and more specifically 30:7 to 70:30. An exemplary weight ratio of the copolymer of A and X and the copolymer of B and X is 50:50. The copolymer of A and X and the copolymer of C and X may be used in weight ratios of 1:99 to 99:1, specifically 10:90 to 90:10, and more specifically 30:7 to 70:30. An exemplary weight ratio of the copolymer of A and X and the copolymer of C and X is 50:50.

In one embodiment, the additive copolymer may be a gradient polymerized polymer or a blend of gradient polymerized polymers. A gradient polymerized polymer is one where the percentage of one component (e.g., A, B or C) increases relative to the percentage of the other component (e.g., X) as the copolymer chain is traversed from one end to the other. In one embodiment, the gradient polymerized chain may be a gradient random polymer of A, B and X with increasing X as the copolymer chain is traversed from one end to the other as seen in the formula (7):

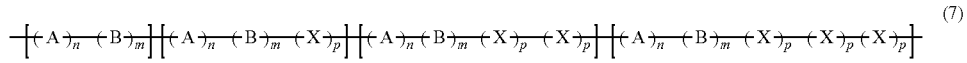 (7)

where A, B and X are as monomeric units as described above, where n, m and p each can have a value of 1 to 50 and can be the same or different or independent to each other. In one embodiment, in the formula (7), n=m for each segment. In other words, if n=m=1 in the first segment, it is the same for each succeeding segment as the copolymer chain is traversed from one end to the other. The value also remains the same for each succeeding segment as the copolymer chain is traversed from one end to the other. The gradient polymerized polymer of formula (7) may be a random copolymer. The molar ratios of A, B and X in the formula (7) are the same as those described for the structure of formula (1) above.

In another embodiment, n, m and p can be independent from each other in each segment but are the same for every succeeding segment as the polymer chain is traversed from one end to the other. In other words, for example, if n=1, m=4 and p=3 for each segment, then it is the same for each succeeding segment as the copolymer chain is traversed from one end to the other.

In another embodiment, the unit A or the unit B in the equation (7) can be replaced with unit C, where C is defined above.

In another embodiment, the additive copolymer can be a block copolymer of A and B with increasing X as the copolymer chain is traversed from one end to the other as shown in the formula (8)

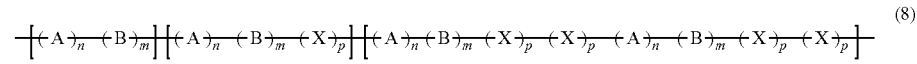 (8)

where A, B and X are as monomeric units as described above, where n, m and p each can have a value of 1 to 50 and can be the same or different or independent to each other. In one embodiment, in the formula (7), n=m for each segment. In other words, if n=m=1 in the first segment, it is the same for each succeeding segment as the copolymer chain is traversed from one end to the other. The value also remains the same for each succeeding segment as the copolymer chain is traversed from one end to the other. In another embodiment, n, m and p can be independent from each other in each segment but are the same for every succeeding segment as the polymer chain is traversed from one end to the other. In other words, for example, if n=1, m=4 and p=3 for each segment, then it is the same for each succeeding segment as the copolymer chain is traversed from one end to the other. The molar ratios of A, B and X in the formula (8) are the same as those described for the structure of formula (1) above. In the formula (8), the unit A or the unit B can be replaced with C.

In another embodiment, the additive copolymer can be a block copolymer with the random incorporations of X into the blocks as seen in the formula (9)

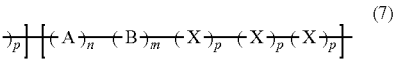 (9)

where in the equation (9), A, B and X have the meanings detailed above, "r" indicates that A and X are randomly copolymerized in a first segment. The first segment has k repeat units. This first segment is copolymerized with a second segment comprising B and X, which are also randomly copolymerized. The second segment has h repeat units. In one embodiment, k and h can be the same or different and can be 1 to 50. The letter "b" in the formula (9) indicates that the first segment and the second segment are in the form of a block copolymer. The molar ratios of A, B and X in the formula (9) are the same as those described for the structure of formula (1) above. The unit A or the unit B in the formula (9) can be replaced with the unit C.

In another embodiment, the block copolymer comprises repeat units of A that are copolymerized with segments comprising B and X that are randomly copolymerized.

$$-(A)_k b-(B\text{-}r\text{-}X)_h- \qquad (10)$$

where A, b, B, r, k, h and X have the meanings ascribed to them above. The molar ratios of A, B and X in the formula (7) are the same as those described for the structure of formula (1) above. The unit A or the unit B in the formula (10) can be replaced with the unit C. It is to be noted that the additive copolymer of the formulas (1) through (10) may be deployed in a star block configuration if desired.

Figure 3:
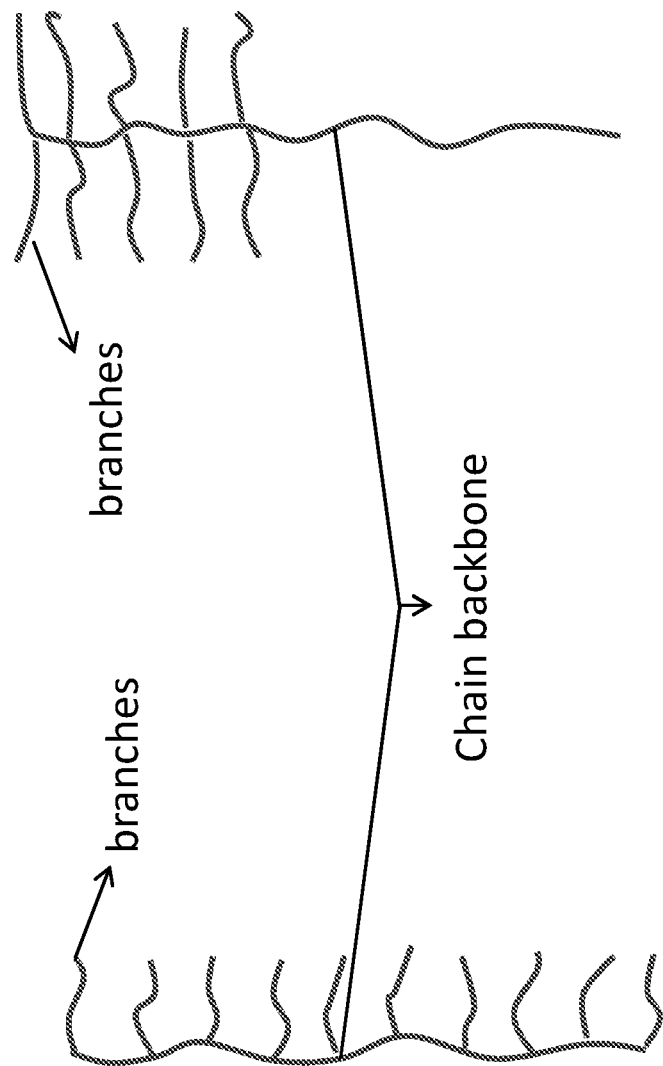
FIG. 3(A) depicts a copolymer having a comb topology with branches that are grafted onto the chain backbone and extend in only one direction.
FIG. 3(B) depicts a copolymer having a bottle brush topology with branches that are grafted onto the chain backbone and extend radially in all directions from the chain backbone.

In another embodiment, the additive copolymer (that facilitates the formation of the neutral layer) may be a graft polymer. For example, the additive copolymer may have a comb topology or can comprise a bottle brush type copolymer. A comb topology is where the copolymer backbone has grafted onto it a number of branches of roughly equivalent number of repeat units as shown in the FIG. 3(A). As can be seen in the FIG. 3(A), the branches that are grafted onto the chain backbone extend in only one direction from the backbone. In the bottle brush type copolymer, a portion of the polymeric chain backbone has branches grafted onto it that extend radially in all directions. This is depicted in the FIG. 3(B).

One of the differences between a comb polymer and a "bottle brush" polymer is the density of the branches. In general, combs have fewer grafts that the backbone can still be a random coil. In bottle brushes, the branch density is so high and the backbone is so crowded that they cannot coil and are therefore fully extended.

The additive copolymer can comprise structures shown in the formulas (11), (12) and (13) each of which can be employed in either a comb topology or in a bottle brush topology.

In the formula (11), repeat units of D form the additive copolymer backbone, while repeat units of A, B and X are grafted onto the backbone. The grafts comprising A, B and X are termed side chains and are grafted onto the backbone of the additive copolymer as seen in the structure of formula (11).

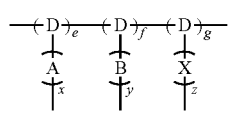

(11)

where repeat units of D form the chain backbone and where repeat units of A, B and X are grafted onto the backbone. A, B and X are as defined above. The number of repeat units e, f and g can be the same or different from each other, while the number of repeat units x, y and z can be the same or different from each other as well. In an exemplary embodiment, each of e, f and g can be an amount of 1 to 50, specifically 5 to 40, while each of x, y and z can be an amount of 1 to 50, specifically 5 to 40. The additive copolymer of the formula (11) can be a block copolymer or a random copolymer.

In another embodiment, the side chains that are grafted onto the backbone of the additive copolymer can themselves be block copolymers as depicted in the structure of the formula (12)

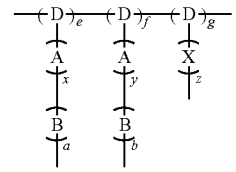

(12)

where D, A, B, X, e, f, g, x, y, and z are as described above. In the formula (12), it can be seen that some of the grafts are block copolymers while others are not. The number of repeat units "a" and "b" can be the same or different from each other and can independently be an amount of 1 to 50, specifically 5 to 40. The number of repeat units a and b can also be the same or different from x and y. The additive copolymer of the formula (12) can be a block copolymer or a random copolymer.

In yet another embodiment, the side chains that are grafted onto the backbone of the additive copolymer can each comprise block copolymers having repeat units of A, B and X as seen in the structure having the formula (13)

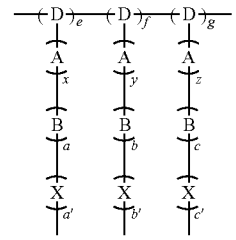

(13)

where D, A, B, X, e, f, g, x, y, and z are as described above. In the formula (13), it can be seen that some of the grafts are block copolymers while others are not. The number of repeat units "a", "b" and "c" can be the same or different from each other and can independently be an amount of 1 to 50, specifically 5 to 40. The number of repeat units "a'", "b'" and "c'" can be the same or different from each other and can independently be an amount of 1 to 50, specifically 5 to 40. The number of repeat units a, b and c can also be the same or different from x, y and z. The number of repeat units a', b' and c' can also be the same or different from x, y and z. The additive copolymer of the formula (13) can be a block copolymer or a random copolymer. Blends of the additive copolymer of the formulas (11), (12) and/or (13) can be used.

It is to be noted that in any of the formulas (1) through (13) above, the unit A may be replaced with a unit A' that is chemically different from unit A, but is completely or partially miscible with it. In a similar manner, unit B may be replaced with another unit B' that is chemically different from unit A, but is completely or partially miscible with it. In this reference A' and B' are referred to as a third polymer and a fourth block polymer respectively.

In one embodiment, the third polymer A' can be the same or different from the first segment A, while the fourth block polymer B' can be the same or different from the second segment B.

The surface free energy reducing moiety can be a molecule that comprises a fluorine atom, a silicon atom, an unsubstituted or substituted $C_1$-$C_{12}$ hydrocarbyl, or a combination thereof.

The surface free energy reducing moiety can be a single unit (i.e., a reacted monomeric unit), an oligomeric unit (i.e., having 2 to 10 repeat units) or a polymeric unit (having more than 10 repeat units) and comprises a reactive functionality. The reactive functionality facilitates a reaction with the repeat units A, B, C or D listed in formulas (1) through (13) detailed above. Examples of these reactive functionalities are alkenyl groups (e.g., vinyl groups), alkynyl groups, epoxide groups, benzyl groups, phenyl groups, hydroxyl groups, carboxylate groups, thiol groups, halogen functional groups, and the like.

Figure 4:
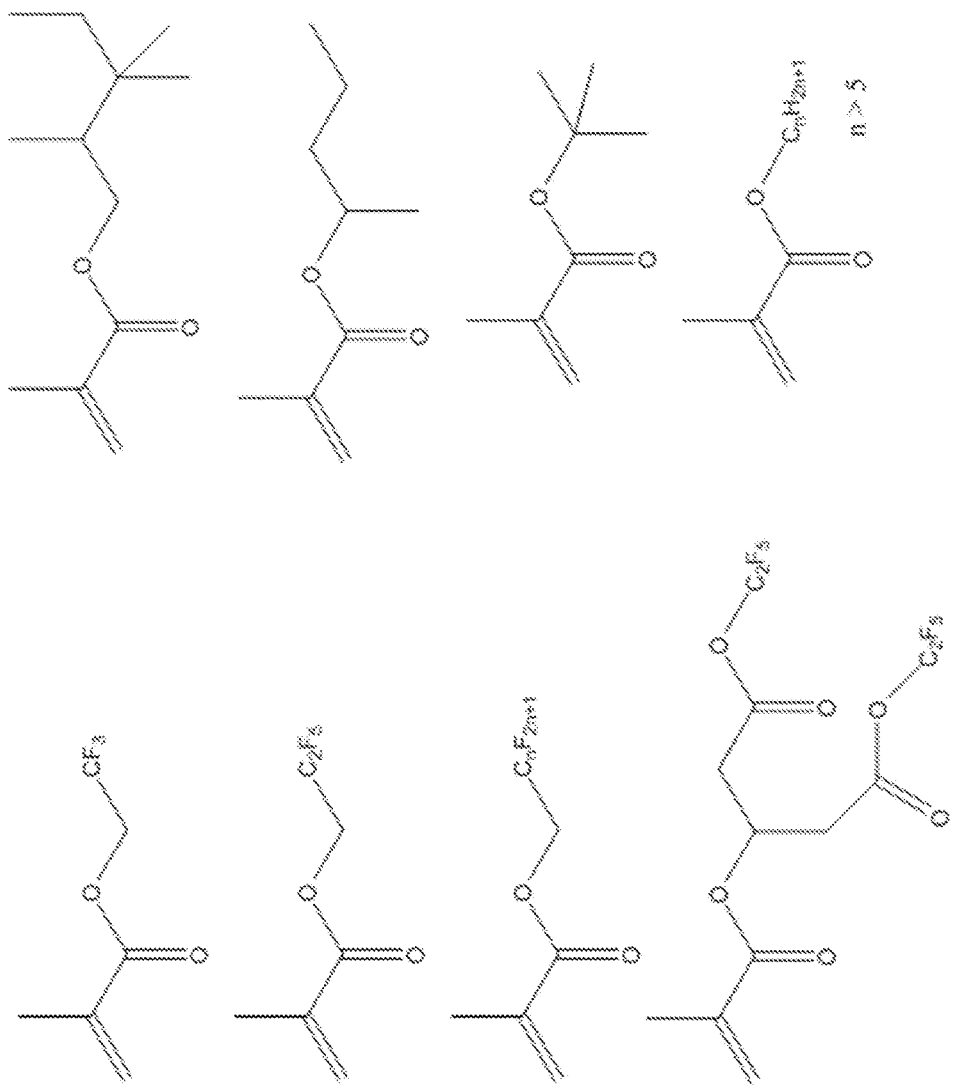
FIG. 4 is a figure the depicts various molecules that can be used as surface energy reducing moiety.

Exemplary surface energy reducing moieties are depicted in the FIG. 4.

The additive copolymer is present in the composition in an amount of 1 to 20 weight percent, based on the total weight of the composition. In a preferred embodiment, the additive copolymer is present in the composition in an amount of 2 to 10 weight percent, based on the total weight of the composition. In an exemplary embodiment, the additive copolymer is present in the composition in an amount of 1 to 20 weight percent, based on the total weights of the solids in the composition.

In one embodiment, in one method of producing the additive copolymer, the reactants along with the appropriate catalysts and solvents are charged to a reaction vessel. The solvent can be a polar solvent, a non-polar solvent or a combination thereof. Solvents that used to formulate and cast the composition can be any which dissolve or disperse the components of the composition. More particularly, suitable solvents to formulate the composition include one or more of alcohols such as n-butanol and alkylene glycols, such as propylene glycol. Non-polar solvents such as aliphatic hydrocarbons, aromatic hydrocarbons, and alkyl ethers such as dodecane, isooctane and isopentyl ether may be used. Exemplary solvents may include 1-methoxy-2-propanol, 1-methoxy-2-propyl acetate, ethyl lactate, anisole, cyclohexanone, 2-heptanone, diacetonealcohol, toluene, trifluorotoluene, or a combination comprising at least one of the foregoing. Preferably, a mixture of different solvents, for example, two, three or more solvents, is used to achieve effective phase separation of the additive copolymer from other polymer(s) in the composition. The solvent or solvent mixture can also be effective to reduce the viscosity of the formulation which allows for reduction in the dispense volume.

In an exemplary aspect, a two-solvent system can be used in the compositions of the invention. The solvent system can include, for example, a primary solvent and an additive solvent. A further exemplary aspect uses a three-solvent system which can include, for example, a primary solvent, an additive solvent and a thinner solvent. One or more additional primary solvent, thinner solvent, additive solvent and/or other solvent may be employed.

The primary solvent exhibits excellent solubility characteristics with respect to the non-solvent components of the topcoat composition. While the desired boiling point of the primary solvent will depend on the other components of the solvent system, the boiling point is typically less than that of the additive solvent (higher evaporation rate than the additive solvent), with a boiling point of from 120 to 140° C. such as about 130° C. being typical. Suitable primary solvents include, for example, C4 to C8 n-alcohols, such as n-butanol, isobutanol, 2-methyl-1-butanol, isopentanol, 2,3-dimethyl-1-butanol, 4-methyl-2-pentanol, isohexanol and isoheptanol, isomers thereof and mixtures thereof. The primary solvent is present in an amount of from 30 to 97 wt % based on the solvent system.

The additive solvent is present to facilitate phase separation between the additive copolymer and other resin(s) in the composition. In addition, the lower evaporation rate of the additive solvent can reduce the tip drying effect during coating. It is typical for the additive solvent to have a higher boiling point (lower evaporation rate) than the other components of the solvent system. The desired evaporation rate of the additive solvent will depend on the other components of the solvent system. Suitable additive solvents include, for example, hydroxy alkyl ethers, such as those of the formula:

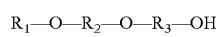

$$R_1-O-R_2-O-R_3-OH$$

wherein $R_1$ is an optionally substituted C1 to C2 alkyl group and $R_2$ and $R_3$ are independently chosen from optionally substituted C2 to C4 alkyl groups, and mixtures of such hydroxy alkyl ethers including isomeric mixtures. The additive solvent is typically present in an amount of from 3 to 15 wt % based on the solvent system.

The thinner solvent, if present, can lower the viscocity and improve coating coverage at a lower dispensing volume. The thinner solvent is typically a poorer solvent for the non-solvent components of the composition relative to the primary solvent. While the desired boiling point of the thinner solvent will depend on the other components of the solvent system, the boiling point is typically greater than that of the primary solvent (lower evaporation rate than the primary solvent). Suitable thinner solvents include, for example, alkanes such as C8 to C12 n-alkanes, for example, n-octane, n-decane and dodecane, isomers thereof and mixtures of isomers thereof; and/or alkyl ethers such as those of the formula $R_1$—O—$R_2$, wherein $R_1$ and $R_2$ are independently chosen from $C_2$ to $C_8$ alkyl, $C_2$ to $C_6$ alkyl and $C_2$ to $C_4$ alkyl. The alkyl ether groups can be linear or branched, and symmetric or asymmetric. The thinner solvent, if present, is typically present in an amount of from 10 to 70 wt % based on the solvent system.

The reactants in the reaction vessel are subjected to the appropriate conditions of temperature and pressure. The reactants may also be agitated during the reaction. The reactions may be conducted under a blanket of an inert gas to prevent undesirable oxidation of the reactants. When the reaction has proceeded to the appropriate extent, a quenching agent may be added to the reaction vessel to inhibit further reaction. The products along with any unreacted reactants may then be extracted from the reaction vessel and purified. Purification may be conducted by filtration, decantation, centrifuging, distillation, crystallization, or a combination thereof.

In one embodiment, in one manner of producing a nanostructured coating, the block copolymer and the additive copolymer are blended together with a suitable solvent and blended together. The blending can be conducted in a variety of mixers and blenders, where shear force, extensional force, compressive force, ultrasonic energy, electromagnetic energy, thermal energy or combinations comprising at least one of the foregoing forces or forms of energy are used. The blending is conducted in processing equipment wherein the aforementioned forces and forms of energy are exerted by a single screw, multiple screws, intermeshing co-rotating or counter rotating screws, non-intermeshing co-rotating or counter rotating screws, reciprocating screws, screws with pins, barrels with pins, rolls, rams, helical rotors, or combinations comprising at least one of the foregoing.

Blending involving the aforementioned forces may be conducted in machines such as single or multiple screw extruders, Buss kneaders, Henschel mixers, helicones, Ross mixers, Banbury, roll mills, molding machines such as injection molding machines, vacuum forming machines, blow molding machines, or then like, or combinations comprising at least one of the foregoing machines.

Following the blending, the composition is disposed upon a substrate. The substrate may or may not have disposed upon it a surface modification layer. The composition may be disposed on the substrate in the form of a coating having a thickness of 5 to1000 nm. The coating is formed by methods that include spin casting, dip coating, spray painting, or by application via a doctor blade.

Figure 5:
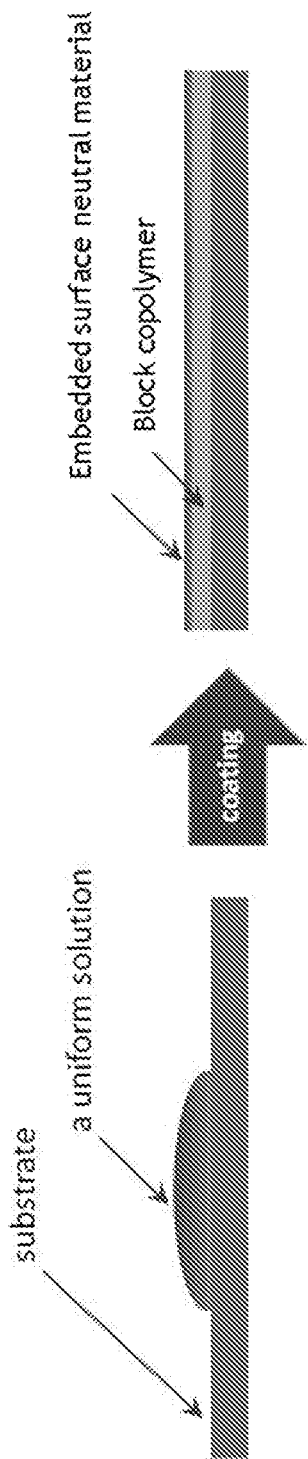
FIG. 5 is a figure depicting the formation of the neutral layer from the additive copolymer that is mixed with the block copolymer.
Figure 6:
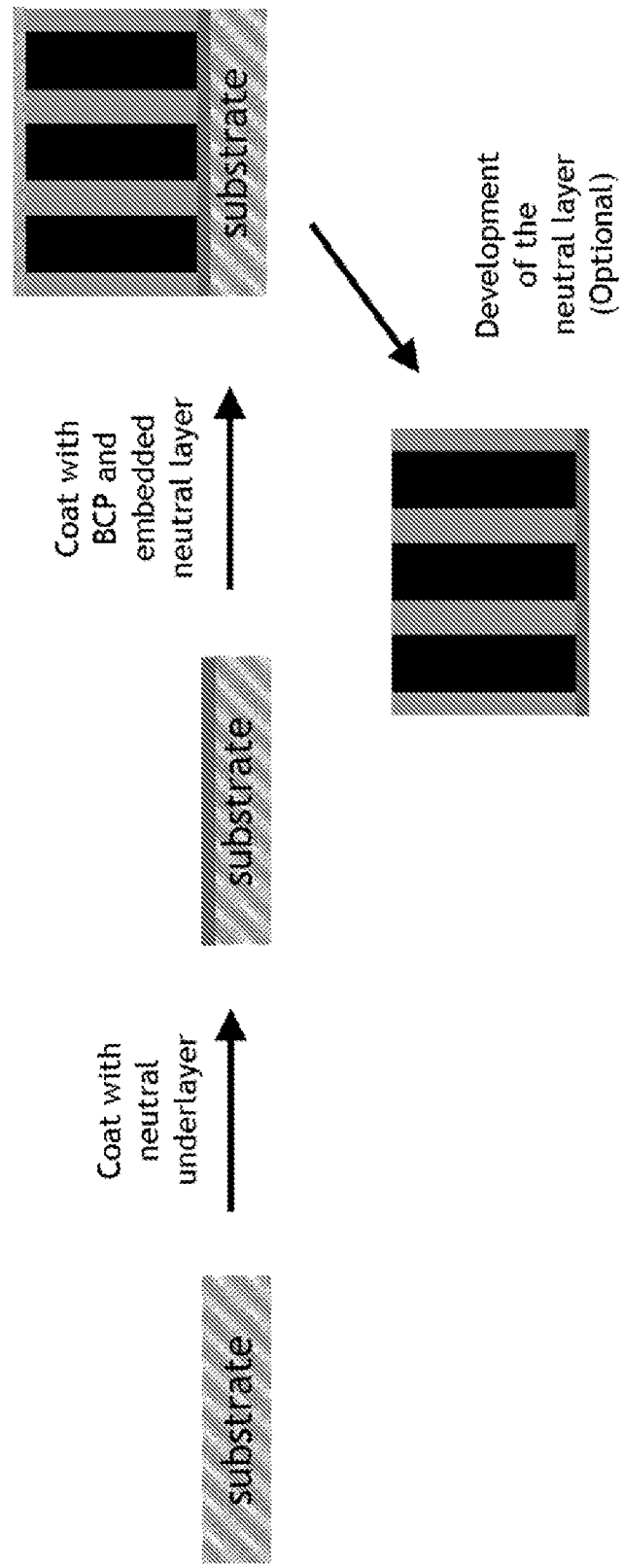
FIG. 6 is another figure depicting the formation of the neutral layer and the formation of perpendicular blocks in the block copolymer.

FIGS. 5 and 6 depict the mechanism by which the embedded neutral layer facilitates the formation of perpendicular domains in the block copolymer. In the FIG. 5, the composition is disposed directly on the substrate to contact it, while in the FIG. 6, a surface modification layer is disposed upon the substrate surface. The composition is spread across the surface and may be subjected to annealing to remove solvent and to facilitate the domain formation in the block copolymer (BCP). During annealing, the surface free energy reducing moiety present in the additive copolymer facilitates the formation of the neutral layer at the free surface. The neutral layer provides the appropriate surface energetic character to promote domain (i.e., micro-domain or nano-domain) formation in the block copolymers; where the domains are perpendicular to the substrate. The neutral layer comprises the additive copolymer.

The neutral layer on the surface of the block copolymer may then be treated to remove it. It may be reactively ion etched, dissolved by dissolution in a solvent, chemically removed through chemical planarization or mechanically abraded. The block copolymer with its domains oriented perpendicular to the substrate may then be treated to form a template or a resist and used in the manufacturing of semiconductor chips, or other electronic articles.

The compositions and the methods disclosed herein are exemplified by the following non-limiting examples.

EXAMPLES

These examples demonstrate the surface tension between the components of the additive copolymer present in the composition that can lead to the formation of a neutral surface layer on the surface of the block copolymer. As detailed above, the additive copolymer is added to the block copolymer to form the disclosed composition. When an additive copolymer detailed in the examples below is added to the block copolymer, it permits the formation of segments (of the block polymer in the composition) that are perpendicular to the surface of the substrate upon which the blocks are disposed. The additive copolymer phase separates from the block copolymer to form a neutral layer on the surface of the block copolymer.

It is desirable to form a neutral layer on both the top and bottom of the film having a balanced surface tension between the neutral layer with the blocks of the block copolymer. In this example, if a block copolymer comprises homopolymers of A and B, the surface tension between the blocks A and B and the neutral layers are measured. The material is considered neutral when the difference in surface tension between itself and blocks A and B are approximately equal.

The Table 1 below depicts block copolymers and additive copolymers that can be used in a composition to facilitate the formation of blocks perpendicular to the surface of the substrate.

In the Table 1, the components of the block copolymer are first assumed. For example in the case of sample #1, it is assumed that one of the blocks of the block copolymer is polystyrene (PS) and the second block is polydimethylsiloxane (PDMS). A third polymer can be found to have a balanced surface tension between itself, PS, and PDMS by first calculating the surface tension between PS and the third polymer and PDMS and the third polymer using the polar and dispersive forces of the PS and PDMS, where the surface tension ($\gamma$) between two polymers (i and j) is defined by the following equation (I), where $\sigma i,_{Total}$ is the total surface energy and $\sigma_d$ and $\sigma_p$ are the dispersive and polar components, respectively. in Equation (I), $$\gamma_{i,j} = \sigma_{i,Total} + \sigma_{j,Total} - 4\frac{\sigma_{i,p}\sigma_{j,p}}{\sigma_{i,p}+\sigma_{j,p}} - 4\frac{\sigma_{i,d}\sigma_{j,d}}{\sigma_{i,d}+\sigma_{j,d}}, \quad (I)$$

The material can be considered neutral when the difference in these surface tensions between the third polymer and PS and the third polymer and PDMS, defined as $|\gamma_x\gamma_y|$, are equal to 0, i.e., it is to be minimized if it cannot be equal to 0. The desirable surface energy of the third polymer is calculated by adjusting the values until the difference in surface tensions is equal to 0. This is referred to as the "optimal" value in Table 1.

In a similar manner, using the equation (I) and known surface energies, polymers can be found that have similar surface tension with the respective component polymers of the block copolymer. Listed below in the Table 1, are some potential materials for PS-PDMS, PMMA-PDMS, and PS-P2VP diblocks. In the first set of numbers, the values of surface energy that provide the minimum difference in surface tension, $|\gamma_x-\gamma_y|$ were calculated, thus representing an "optimal" third polymer with minimal difference in surface tension. Following this, polymeric materials with surface energies matching those of the optimal case were found. For example, the surface tension between poly(n-hexylmethacrylate) (PHMA) and polystyrene is very similar to that between poly(n-hexylmethacrylate) and polydimethylsiloxane. Therefore, PHMA is effective as both a surface modification layer and as the component of an additive copolymer with affinity to the block copolymer. The additive copolymer also contains a surface free energy reducing moiety with lower surface free energy than either PS or PDMS, such as a polymer segment based on poly(heptadecafluorooctyl methacrylate), which has $\sigma i,_{Total}$ =15.3 mN/m. A useful additive copolymer is a block copolymer with PHMA and poly(heptadecafluorooctyl methacrylate) blocks.

Poly(n-butylmethacrylate) (PBMA) provides a minimal difference in surface tension between itself and poly(methyl methacrylate) (PMMA) and polydimethylsiloxane. PBMA is therefore effective as a surface modification layer, and a block copolymer with PBMA and poly(heptadecafluorooctyl methacrylate) blocks is an effective additive copolymer to facilitate the formation of blocks of PS and PDMS perpendicular to the surface of the substrate upon which the material is disposed.

Similarly, poly(5 and 6-[3,3,3-trifluro-2-hydroxy-2-(trifluoro-methyl)propyl]bicyclo-[2.2.1]hept-2-yl methacrylate) (PMABTHBNB) provides a minimal difference in surface tension between itself and polystyrene and poly(2- vinylpyridine). PMABTHBNB therefore serves as an effective surface modification layer and component of an additive copolymer with affinity to the block copolymer. Additive copolymers for PS-block-P2VP include block copolymers bearing PMABTHBNB blocks, such as PMABTHBNB-block-PHMA, PMABTHBNB-block-poly(heptadecafluorooctyl methacrylate) and PMABTHBNB-block-PDMS.

Synthesis of PMMA Macro-RAFT (Reversible Addition-Fragmentation chain Transfer) Agent 2.52 g MMA (0.026 mole), 1.09 g 25% PGMEA solution of 2-phenylpropan-2-yl benzodithioate (1.008 mmole) and 0.046 g V601 (0.202 mmole) were added to a reaction flask. Reagents were deoxygenated by 3 successive freeze-pump-

TABLE 1

| Sample No. | Polymer i | $\sigma_{Total}$ (mN/M) | $\sigma_d$ (MN/m) | $\sigma_p$ (mN/m) | Polymer j | $\sigma_{Total}$ (mN/m) | $\sigma_d$ (mN/m) | $\sigma_p$ (mN/M) | $\gamma_{i,j}$ (mN/M) | $\lvert\gamma_x - \gamma_y\rvert$ (mN/m) |
|---|---|---|---|---|---|---|---|---|---|---|
| #1 | PDMS | 19.8 | 19 | 0.8 | optimal | 31.4 | 28.4 | 3.0 | 3.1 | 0.0 |
|  | PS | 42.5 | 41.3 | 1.2 | optimal | 31.4 | 28.4 | 3.0 | 3.1 |  |
|  | PDMS | 19.8 | 19 | 0.8 | PHMA | 30 | 27 | 3.0 | 2.7 | 1.1 |
|  | PS | 42.5 | 41.3 | 1.2 | PHMA | 30.0 | 27.0 | 3.0 | 3.8 |  |
| #2 | PDMS | 19.8 | 19 | 0.8 | optimal | 31.9 | 28.0 | 3.9 | 3.8 | 0.0 |
|  | PMMA | 41.1 | 29.6 | 11.5 | optimal | 31.9 | 28.0 | 3.9 | 3.8 |  |
|  | PDMS | 19.8 | 19 | 0.8 | PBMA | 31.2 | 26.2 | 5.0 | 4.2 | 1.4 |
|  | PMMA | 41.1 | 29.6 | 11.5 | PBMA | 31.2 | 26.2 | 5.0 | 2.8 |  |
| #3 | PS | 42.5 | 41.3 | 1.2 | optimal | 29.0 | 24.6 | 4.4 | 6.1 | 0.0 |
|  | P2VP | 50.3 | 39.6 | 10.7 | optimal | 29.0 | 24.6 | 4.4 | 6.1 |  |
|  | PS | 42.5 | 41.3 | 1.2 | PMABTHBNB* | 29.3 | 24.3 | 5.0 | 6.7 | 1.0 |
|  | P2VP | 50.3 | 39.6 | 10.7 | PMABTHBNB* | 29.3 | 24.3 | 5.0 | 5.7 |  |

*poly(5 and 6-[3,3,3-trifluroro-2-hydroxy-2-(trifluoro-methyl)propyl]bicycro-[2.2.1]hept-2-yl methacrylate)

From the Table 1, it may be seen that by balancing the surface energy between the neutral layer and the respective blocks of the block copolymer, the respective blocks of the block copolymer can be selected for producing domains that are perpendicular to the surface of the substrate that the blocks are cast upon.

Example 2

The example were conducted to demonstrate the application of self-segregated embedded neutral layer on top of a lamellar block copolymer to control the orientation of the block copolymer. In this example, the first block copolymer was a polystyrene-block-poly(2-vinylpyridine) (PS-b-P2VP). The second copolymer was a poly(1,1,1,3,3,3-hexafluoroisopropyl methacrylate)-block-poly(methyl methacrylate) (PHFiPMA-b-PMMA). As will be detailed later, the PHFiPMA-b-PMMA was added to the PS-b-P2VP formulation as a minor additive. The formulation was coated on a substrate that had a hydroxyl terminated poly(styrene-ran-(2-vinylpyridine) (P(S-r-P2VP)-OH) brush as the surface modification layer, while the PHFiPMA-b-PMMA migrated to the top of the film to act as an embedded neutral top during spin coating. The details of this experiment are provided and discussed below.

All materials were purchased from Aldrich, except where noted, and were either used as received or purified as discussed below. Styrene was passed through activated neutral alumina. 2-vinyl pyridine (2VP), 1,1,1,3,3,3-hexafluoroisopropyl methacrylate (HFiPMA), and methyl methacrylate (MMA) were passed through activated basic alumina. Solvents were used as received. Monomers and solvents for polymerization were also deoxygenated by either purging with dry argon or 3 successive freeze-pump-thaw cycles. A lamellar-forming PS-b-P2VP block copolymer with 50 wt % P2VP, Mn=50 kg/mol, Mw/Mn=1.1 was purchased from Polymer Source (Catalog number: P18220-S2VP); the PS-b-P2VPwas characterized to have a pitch, $L_0$, of 28 nm as determined by SEM. Poly(1,1,1,3,3,3-hexafluoroisopropyl methacrylate) (PHFiPMA) and poly(methyl methacrylate) (PMMA) have reported glass transition temperatures ($T_g$) of 56° C. and 105° C. (http://www.safeglobal.com).

thaw cycles. The solution was sparged with nitrogen for 15 minutes and then placed in a preheated oil bath at 70° C. for 20 hours. After the reaction, the system temperature was cooled down to room temperature. The reaction mixture was diluted with acetone and precipitated from methanol and dried in an oven at 60° C. overnight (Mw=6.45k, Mn=5.29k, PDI=1.32).

Synthesis of PHFiPMA-b-PMMA 0.88 g (0.0089 mole) PMMA Macro-RAFT material was dissolved in 3.5 g PGMEA, then mixed with 2.62 g HFiPMA (0.0106 mole) and 0.005 g V601 (0.022 mmole) in a reaction flask. The solution was sparged with nitrogen for 15 minutes and then placed in a preheated oil bath at 70° C. for 20 hours. The reaction mixture was diluted with THF and precipitated from methanol and dried in an oven at 60° C. overnight. The material contained 56 wt % HFiPMA and 44 wt % PMMA by $^{13}C$ NMR and had Mn=8.5 kg/mol and Mw/Mn=1.31 as measured by GPC.

Synthesis of P(S-r-P2VP)-OH

Styrene (11.95 g, 0.115 mole), 2-vinyl pyridine (8.05 g, 0.077 mole), and (4-(1-((tert-butyl(2-methyl-1-phenylpropyl)amino)oxy)ethyl)phenyl)methanol (1.95 g , 2.0 mmole of 36.5wt % stock solution in PGMEA) were added to a reaction flask equipped with a magnetic stirring bar. Reagents were deoxygenated by 3 successive freeze-pump-thaw cycles. The solution was sparged with nitrogen for 15 minutes and then placed in a preheated oil bath at 120° C. for 16 hour mperature was cooled down to room temperature. The reaction mixture was diluted with THF and precipitated from heptane and dried in an oven at 60° C. overnight. The resulting to give a hydroxyl terminated poly(styrene-ran-poly(2-vinylpyridine) (P(S-r-P2VP)-OH) had 56 wt % 2VP, Mn=10.8 kg/mol, and Mw/Mn=1.23.

Preparation of Substrates with P(S-r-P2VP)-OH Brush

The P(S-r-P2VP)-OH random copolymer brush was coated on the wafers by spin coating a 0.8 wt % solution of P(S-r-P2VP)-OH in propylene glycol methyl ether acetate (PGMEA) at 1500 rpm. Wafers were annealed at 250° C. for 5 minutes in an oven under $N_2$. The wafers were cooled to room temperature and rinsed with excess PGMEA.

Comparative Example 1

Thermal Annealing of Neat Lamellar PS-b-P2VP

Figure 7:
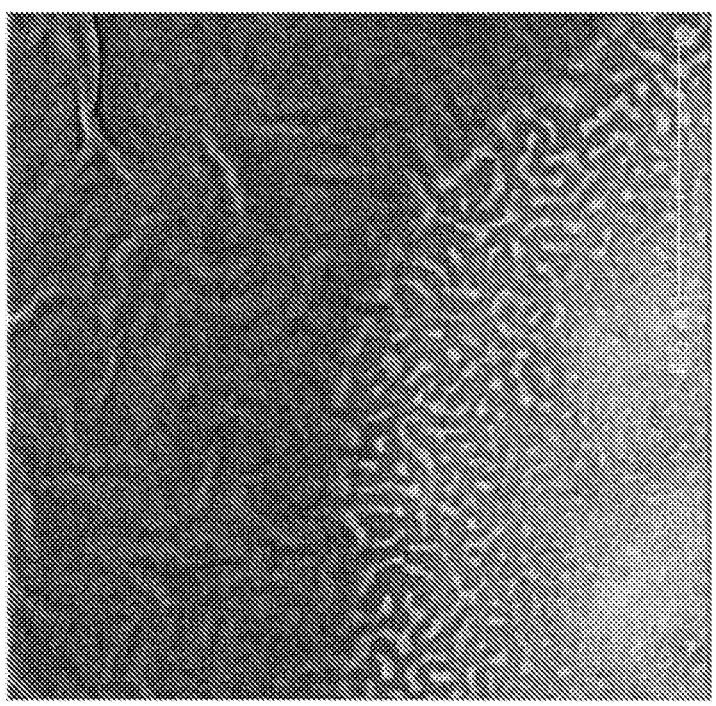
FIG. 7 is a micrograph showing an island/hole morphology was observed, suggesting the PS-b-P2VP aligned parallel to the substrate.

A silicon substrate with native oxide was treated by spin coating 1.2 wt % (solids) solutions of P(S-r-P2VP)-OH in PGMEA. The coated film was baked at 150° C. for 1 minute and annealed at 250° C. under nitrogen for 5 minutes. The substrate was then soaked in PGMEA for 1 minute, spun dry at 3,000 rpm for 1 min and baked at 150° C. for 1 min. Lamellar PS-b-P2VP (Polymer Source, P18220-S2VP) was dissolved in co-solvent of propylene glycol methyl ether acetate (PGMEA) and gamma-butyrolactone (GBL) at 95/5 to form a 1.5 wt % solution (Formulation 1). Formulation 1 was spin cast onto substrates treated with the P(S-r-P2VP)-OH brush. Films were coated at a thickness of 32 nm (with thickness≈$1L_0$), where $L_0$=28 nm is the domain spacing of the PS-b-P2VP. The combined films were annealed under $N_2$ at 250° C. for 5 minutes. The resulting film was examined using SEM (see FIG. 7). An island/hole morphology was observed, suggesting the PS-b-P2VP aligned parallel to the substrate, consistent with the anticipated morphology due to the difference in surface energy of the respective PS and P2VP blocks of the PS-b-P2VP.

Example 3

PS-b-P2VP Thin Film with Embedded Neutral Layer (PHFiPMA-b-PMMA)

Figure 8:
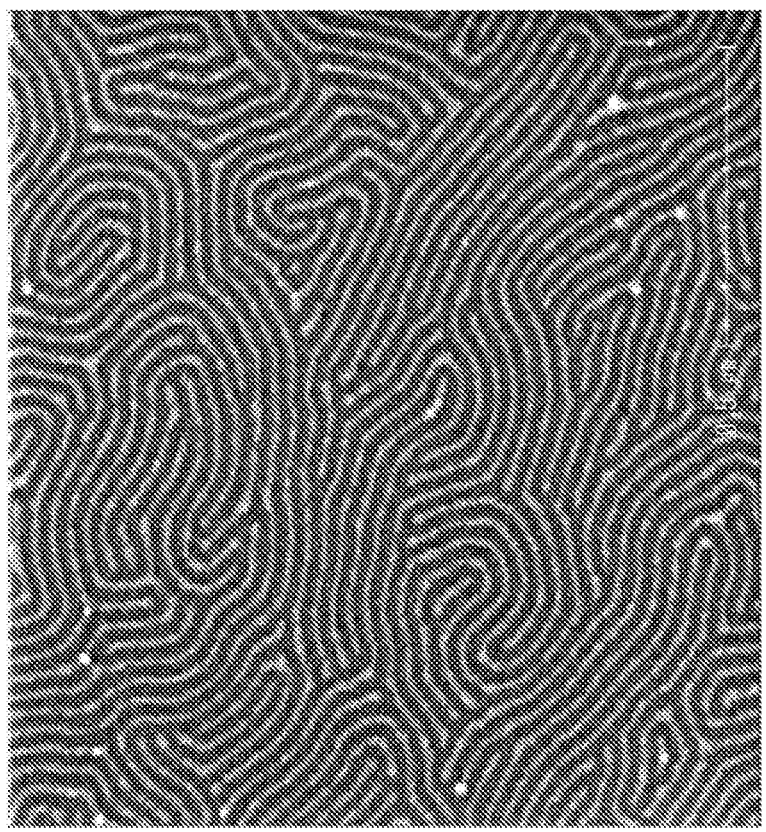
FIG. 8 is a micrograph showing a fingerprint pattern morphology characteristic of perpendicular orientated lamellar block copolymer for the PS-b-P2VP thin film with embedded neutral layer comprising PHFiPMA-b-PMMA.

A silicon substrate with native oxide was treated by spin coating 1.2 wt % (solids) solutions of P(S-r-P2VP)-OH in PGMEA. The coated film was baked at 150° C. for 1 minute and annealed at 250° C. under nitrogen for 5 minutes. The substrate was then soaked in PGMEA for 1 minute, spun dry at 3,000 rpm for 1 min and baked at 150° C. for 1 min. Lamellar PS-b-P2VP (Polymer Source, P18220-S2VP) and PHFiPMA-b-PMMA (20 wt % loading relative to PS-b-P2VP) were dissolved in co-solvent of propylene glycol methyl ether acetate (PGMEA) and gamma-butyrolactone (GBL) at 95/5 to form a 1.5 wt % solution (Formulation 2). Formulation 2 was spin cast onto substrates treated with the P(S-r-P2VP)-OH brush. Films were coated at a thickness of 38 nm (with anticipated thickness according to the blend ratio of 7 nm for the PHFiPMA-b-PMMA and thickness of PS-b-P2VP≈$1L_0$, where $L_0$=28 nm is the domain spacing (pitch) of the PS-b-P2VP). The combined films were annealed under $N_2$ at 250° C. for 5 minutes. This annealing temperature was above the Tg of the PS-P2VP as well as the highest-Tg component of the embedded neutral layer material (105° C.). After annealing, a SEM micrograph (see FIG. 8) reveals a fingerprint pattern characteristic of perpendicular orientated lamellar block copolymer. This demonstrates the embedded neutral layer effectively controlled the orientation at the top of the film stack to enable the PS-b-P2VP domains to achieve perpendicular orientation under aggressive thermal annealing conditions.

Example 4

Directed Self-assembly of PS-b-P2VP Thin Film with Embedded Neutral Layer (PHFiPMA-b-PMMA)

Figure 9:
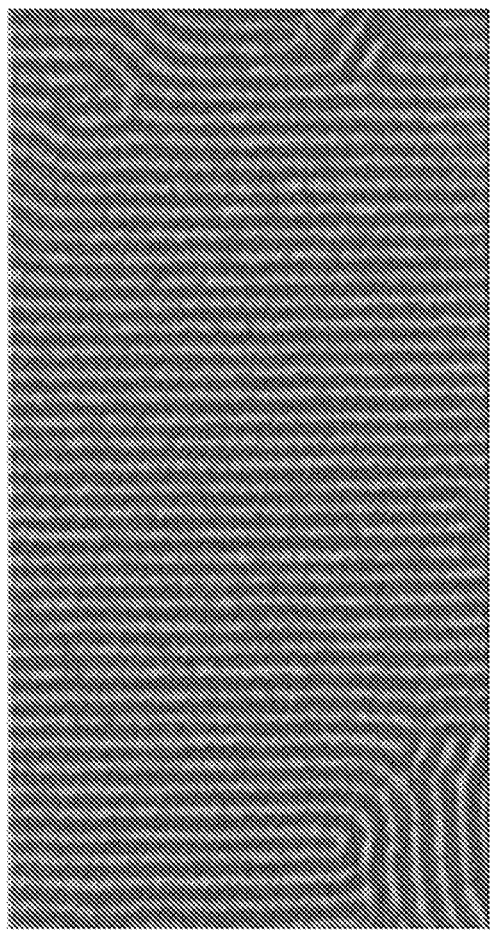
FIG. 9 is a micrograph showing directed self-assembly of PS-b-P2VP thin film with embedded neutral layer comprising PHFiPMA-b-PMMA. The figure shows a lamellar block copolymer morphology with lamellae oriented perpendicular to the substrate.

A chemical patterned substrate was prepared by spin coating 1.2 wt % (solids) solutions of P(S-r-P2VP)-OH in PGMEA on the chemoepitaxy templates with isolated polystyrene stripes (84 nm pitch, 14 nm CD) prepared using methods described in Liu et al. in Macromolecules, 44 (7), 1876-1885, 2011. The chemically patterned substrate was baked at 150° C. for 1 minute and annealed at 250° C. under nitrogen for 5 minutes. The substrate was then soaked in PGMEA for 1 minute, spun dry at 3,000 rpm for 1 min and baked at 150° C. for 1 min. Lamellar PS-b-P2VP (Polymer Source, P18220-S2VP) and PHFiPMA-b-PMMA (20 wt % loading relative to PS-b-P2VP) were dissolved in co-solvent of propylene glycol methyl ether acetate (PGMEA) and gamma-butyrolactone (GBL) at 95/5 to form a 1.5 wt % solution (Formulation 2). Formulation 2 was spin cast onto substrates treated with the P(S-r-P2VP)-OH brush. Films were coated at a thickness of 38 nm (with anticipated thickness according to the blend ratio of 7 nm for the PHFiPMA-b-PMMA and thickness of PS-b-P2VP≈$1L_0$, where $L_0$=28 nm is the domain spacing (pitch) of the PS-b-P2VP). The combined films were annealed under $N_2$ at 250° C. for 5 minutes. The resulting film was examined using SEM (See FIG. 9). A lamellar block copolymer morphology with lamellae oriented perpendicular to the substrate was again observed, but in this case rather than a random fingerprint-type morphology, the lamella aligned to the underlying chemical pattern displayed. This demonstrates the embedded neutral layer approach is amenable to directed self-assembly using chemical prepatterns with thermal annealing conditions

What is claimed is:
1. A composition comprising:
    a block copolymer comprising a first segment and a second segment that are covalently bonded to each other and that are chemically different from each other; where the first segment has a first surface free energy and where the second segment has a second surface free energy;
    an additive copolymer; comprising segment A and segment B and a surface energy reducing moiety X, where segment A comprises repeat units of unit A and segment B comprises repeat units of unit B, where the surface free energy reducing moiety X has a lower surface free energy than that of the segment A and the segment B; where segment A or segment B has an affinity for either the first segment or the second segment; where the surface free energy reducing moiety X is chemically different from the first segment and from the second segment and comprises a fluorine atom, a silicon atom, an unsubstituted or substituted $C_1$-$C_{12}$ hydrocarbyl, or a combination thereof; where the additive copolymer is not water miscible; where the additive copolymer is not covalently bonded with the block copolymer; where the additive copolymer is operative to form a neutral layer on a surface of the block copolymer and to facilitate formation of domains in the block copolymer that are perpendicular to a surface of a substrate that the composition is disposed on; where the surface free energy reducing moiety X is covalently bonded to either segment A or segment B; and where the surface free energy reducing moiety X is a single repeat unit, an oligomeric repeat unit, or a polymeric repeat unit; and
    a solvent.
2. The composition of claim 1, where the additive copolymer is a random copolymer, or a block copolymer having the structure of formula (1)

 (1)

where segment A and segment B are chemically similar to the first segment and the second segment in the block copolymer, where n is 1 to 50, m is 1 to 50 and where p is 1 to 50, where n, m and p are independent or each other.

3. The composition of claim 2, where the random copolymer or a block copolymer comprises repeat units A, C, or X and having the structure of formula (2)

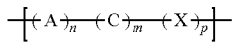 (2)

where C is an alternative unit that can be combined with the units A or B to achieve neutrality for the additive copolymer, where the neutrality provides an appropriate surface energetic character to promote domain formation in the block copolymer.

4. The composition of claim 1, where the additive copolymer can comprise a block copolymer comprising blocks of units A and B and blocks of X as shown by a structure of formula (3)

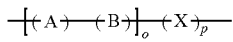 (3)

where units of A and B are arranged to alternate with each other and form a first block while the surface free energy reducing moiety X forms a second block; where o has a value of 1 to 50 and p has a value of 1 to 50; and where o and p are independent of each other.

5. The composition of claim 1, where the additive copolymer is a gradient polymerized polymer or a blend of gradient polymerized polymers where the gradient polymerized polymer is a gradient random polymer of A, B and X with an increasing value of X as the copolymer chain is traversed from one end to the other as seen in formula (7):

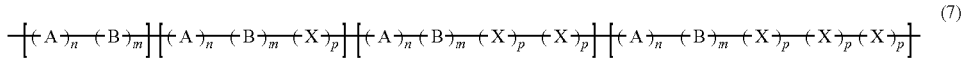 (7)

where n, m and p each can have a value of 1 to 50 and can be the same or different or independent to each other.

6. The composition of claim 1, where in the formula (7), n=m for each segment.

7. The composition of claim 1, where the additive copolymer is a block copolymer of A and B with increasing X as the copolymer chain is traversed from one end to the other as shown in the formula (8)

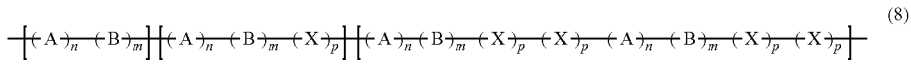 (8)

where n, m and p each can have a value of 1 to 50 and can be the same or different or independent to each other.

8. The composition of claim 1, where the additive copolymer is a block copolymer with the random incorporations of X into the blocks as seen in the formula (9)

 (9)

where "r" indicates that A and X are randomly copolymerized in a first segment, "b" indicates that segment (A-r-X) and segment (B-r-X) are in the form of a block copolymer; and where k and h are the same or different and are 1 to 50.

9. The composition of claim 8, where the additive copolymer is a block copolymer that comprises repeat units of A that are copolymerized with segments comprising B and X that are randomly copolymerized a shown in the formula (10)

 (10).

10. The composition of claim 8, where the additive copolymer comprises structures shown in the formulas (11), (12) and (13) each of which can be employed in either a comb topology or in a bottle brush topology

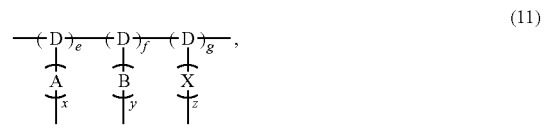 (11)

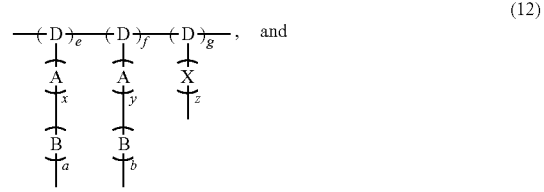 (12)

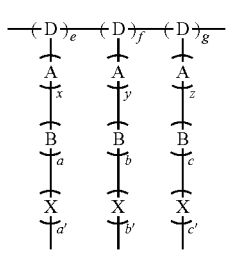 (13)

where in the formulas (11) through (13) repeat units of D form the additive copolymer backbone, while repeat units of A, B and X are grafted onto the backbone; where the number of repeat units e, f and g can be the same or different from each other; where the number of repeat units x, y and z can be the same or different from each other and where each of e, f and g are an amount of 1 to 50; where x, y and z are an amount of 1 to 50; where in the formula in formula (12), "a" and "b" can be the same or different from each other and can independently be an amount of 1 to 50; where in the formula (13), "a", "b" and "c" can be the same or different from each other and can independently be an amount of 1 to 50; where "a'", "b'" and "c'" can be the same or different from each other and are independently an amount of 1 to 50; where a, b and c or a', b' and c' are the same or different from x, y and z.

\* \* \* \* \*